United States Patent
Traynor et al.

(10) Patent No.: US 7,545,614 B2
(45) Date of Patent: Jun. 9, 2009

(54) ELECTROSTATIC DISCHARGE DEVICE WITH VARIABLE ON TIME

(75) Inventors: Kevin Traynor, Cary, NC (US); Russell C. Deans, Durham, NC (US); Vincent J. Acierno, Chapel Hill, NC (US)

(73) Assignee: Renesas Technology America, Inc., San Jose, CA (US)

( * ) Notice: Subject to any disclaimer, the term of this patent is extended or adjusted under 35 U.S.C. 154(b) by 0 days.

(21) Appl. No.: 11/239,130

(22) Filed: Sep. 30, 2005

(65) Prior Publication Data
US 2007/0076338 A1  Apr. 5, 2007

(51) Int. Cl.
*H02H 9/00* (2006.01)
(52) U.S. Cl. ........................................ 361/56
(58) Field of Classification Search ............ 361/56
See application file for complete search history.

(56) References Cited

U.S. PATENT DOCUMENTS

| | | | |
|---|---|---|---|
| 5,440,162 A | 8/1995 | Worley | |
| 5,654,862 A | 8/1997 | Worley | |
| 5,946,177 A * | 8/1999 | Miller et al. | 361/56 |
| 6,046,087 A | 4/2000 | Lin | |
| 6,172,383 B1 * | 1/2001 | Williams | 257/173 |
| 6,429,489 B1 | 8/2002 | Botula | |
| 6,618,230 B2 | 9/2003 | Liu | |
| 6,704,179 B2 | 3/2004 | Voldman | |
| 6,867,461 B1 | 3/2005 | Ker | |
| 6,898,061 B1 | 5/2005 | Kimber | |
| 6,917,207 B1 | 7/2005 | Blumenthal | |
| 6,919,602 B2 | 7/2005 | Lin | |
| 7,027,275 B2 * | 4/2006 | Smith | 361/56 |
| 7,102,862 B1 * | 9/2006 | Lien et al. | 361/56 |

OTHER PUBLICATIONS

ESD in Silicon Integrated Circuits, by A. Amerasekera et al., Texas Instruments Inc. USA (2000), pp. 1-4, 9-15.
Designing with ultra-low voltage MOSFET arrays, by Robert Chao, President, Advanced Linear Devices, Inc., Sunnyvale, Calf., PanetAnalog, Aug. 31, 2005.

* cited by examiner

*Primary Examiner*—Stephen W Jackson
*Assistant Examiner*—Christopher J Clark
(74) *Attorney, Agent, or Firm*—Buchanan Ingersoll & Rooney PC

(57) ABSTRACT

Disclosed is an electrostatic discharge device, typically referred to as a power clamping circuit, for minimizing the effects of an initial ESD event as well as providing protection against subsequent ESD events. The power clamp is left fully turned on during and after an ESD event. Subsequent ESD events are those ESD events occurring shortly after an initial ESD event. By using a blocking device such as a diode, the power clamping circuit is maintained in a strong "on" state that fully discharges the initial ESD event and allows for a more rapid response to subsequent ESD events.

23 Claims, 5 Drawing Sheets

ELECTROSTATIC DISCHARGE DEVICE WITH VARIABLE ON TIME

FIELD OF THE INVENTION

This invention relates to a power clamping circuit to limit the effects of an electrostatic discharge (ESD) event on an electronic circuit, and more particularly to a clamping circuit having a sustained on time to ensure complete dissipation of an ESD event.

BACKGROUND OF THE INVENTION

Electrostatic discharge (ESD) events cause numerous problems in the field of integrated circuits. The semiconductor industry has devoted a substantial amount of funds and effort into reducing the damage to integrated circuits caused by ESD events. The problems associated with an ESD event include high voltages that result in large electric fields and current densities in small semiconductor devices, such as integrated circuits. Research conducted by the semiconductor industry has shown that a fair percentage of integrated circuit failures are attributable to ESD events.

A background and history of electrostatic discharge is described in *ESD in Silicon Integrated Circuits*, by A. Amerasekera et al., Texas Instruments Inc., USA (2000), pp. 1-4, 9-15. The static discharge associated with ESD events usually accumulates from handling of the integrated circuits by humans or contact with machines that are used to fabricate integrated circuits. The voltages associated with a typical ESD event can range from 500 volts to potentially 20,000 volts. Typically, an ESD event will last about 100 nanoseconds (ns) with peak currents in the ampere range. The resulting electrostatic discharge has enough energy to cause the failure of electronic devices and components. Damage to the integrated circuits is usually caused by the high thermal energies created by the current discharging through current paths created by high voltage breakdown mechanism during the electrostatic discharge event.

During integrated circuit manufacturing and handling, electrostatic discharge events commonly arise from three sources. The most common is human handling, wherein a person walking across a synthetic floor surface, such as a vinyl floor, can accumulate an electrostatic charge of up to 20 kV. Once the person touches an object of sufficient size, the charge accumulated on the person will discharge from the person to the object. The object is effectively at ground potential when the person touches it. The second source of ESD is during the automatic test and the handling of the integrated circuits during the manufacturing process. As the equipment used to test and handle the integrated circuits moves through its handling and testing routine, if the equipment is improperly grounded, an electrostatic charge can accumulate. The accumulated electrostatic charge will then be discharged when the test and handling equipment contacts the integrated circuits. Finally, it is possible that the integrated circuit (IC) itself will become charged when transported or if it comes in contact with a charged surface or material. If the IC becomes charged, it may remain charged until it comes in contact with a grounded surface, in which case, it will discharge through its pins and potentially create large voltages and currents within the device, resulting in damage to the IC.

The semiconductor industry has developed models to study the impact of the electrostatic discharges based on different criteria. Two of the models are the human body model and the machine model.

The human body model is an ESD testing standard and is used to simulate the ESD event that results from human handling of the integrated circuit. The human body model uses a 100 pF capacitor which is typically charged to 2000 volts at which point the capacitor is discharged through a 1500 ohm resistor and the connecting pins of the integrated circuit or device under test. During the simulated ESD event of the human body model, the discharge time in which the peak current is seen is approximately 10 ns and the decay time is around 150 ns. However, the ESD event can have a duration of approximately 200-500 ns.

The machine model uses a 200 pF capacitor which is typically charged to 200 volts. The capacitor is then discharged through a zero ohm resistor and the pins of the IC or device under test. The effective discharge time of the current is about 15 ns and, depending upon different values used in the model, the discharge time can be up to 30 ns. The two models have a similar decay time of about 150 ns. However, ESD event durations have been known to last up to 1000 ns.

The currents generated by the human body model can be up to 1.5 A, while the machine model generates current up to approximately 3 A, both of which can cause damage to circuitry.

Using the above described models, different ESD protection circuits provide varying time periods to protect against multiple ESD events, and attempt to maintain protection for a longer duration of time, which can last up to approximately 1000 ns.

Prior art systems have been seen where an electrostatic discharge event occurs and a clamping circuit initially limits the amount of ESD voltage seen by the protected device. The basic concept of the ESD clamping device 10, as shown in FIG. 1, comprises an RC circuit 12 that senses the voltage $V_{DDE}$ across the power supply rails of the circuit being protected, and a clamping FET 14 whose gate is connected to the RC circuit 12. When there is a rapid rise in the voltage VDDE across the power supply rails, as might be caused by an ESD event, the clamping FET 14 is turned on, to shunt the large resulting current to ground before it can reach the circuit being protected.

In this basic type of clamping circuit, the time period for which the protection device maintains its protection is of a shorter duration than the complete ESD event. This is due to the fact that the gate voltage of the clamping FET 14 is coupled to the supply rail voltage VDDE. As the ESD voltage decays, the voltage at the gate decreases, thereby weakening the shunting capability of the FET 14. The FET 14 may turn off before the effects of the ESD have fully dissipated. In this case, the ESD current will continue to flow into the protected device, causing the voltage VDDE of the power supply to increase. If left unclamped, the voltage can rise beyond a maximum threshold, and the protected device can still be damaged.

To overcome this deficiency, a second timing circuit has been added to some prior art devices to maintain the duration of protection and hold the clamping circuit on for a longer period of time. An example of such a device is shown in FIG. 2. The operation of the second timing circuit 26, which consists of the gate capacitance of the FET 24 and the resistor 22, is also dependent upon the voltage $V_{DDE}$ across the supply rails, and hence the possibility still exists that the clamping FET 24 may turn off before the ESD event has terminated.

As a result of the failure to completely dissipate the ESD event, the voltage bus may remain charged. If a second ESD event should occur shortly after the initial one, the bus will not have the capacity to absorb some of the voltage, due to its charged state. The clamping circuit 20 must therefore handle all of the current of the subsequent ESD event, which increases the likelihood that protected circuit components could be damaged.

SUMMARY OF THE INVENTION

Disclosed is an electrostatic discharge device, typically referred to as a power clamping circuit, for minimizing the effects of an initial ESD event as well as providing enhanced protection against subsequent ESD events. By using a blocking device such as a diode, the power clamping circuit is maintained in a strong "on" state for a longer duration of time that allows for faster and complete dissipation of the initial event. This strong "on" state is independent of the transient voltage of the power supply line. Further, if the device is not powered, the disclosed power clamping circuit remains in a turned "on" state, for an extended period of time, allowing for a stronger, and a more rapid response to subsequent ESD events. This enables the power clamp circuit to minimize the ESD voltage for subsequent events to a maximum voltage that is below the maximum of the ESD voltage during the initial ESD event. After an ESD event, the power clamp gate remains turned "on" for an extended period of time because the only discharge path available is gate leakage, which is very small compared to the charge stored on the gate of the clamp transistor.

DETAILED DESCRIPTION

Figure 1:
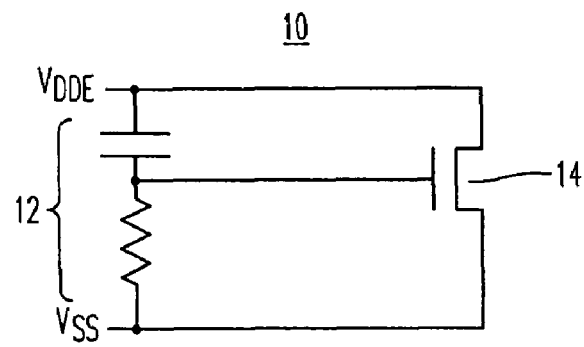
FIG. 1 illustrates an exemplary circuit diagram of a conventional clamping circuit implementation.
Figure 2:
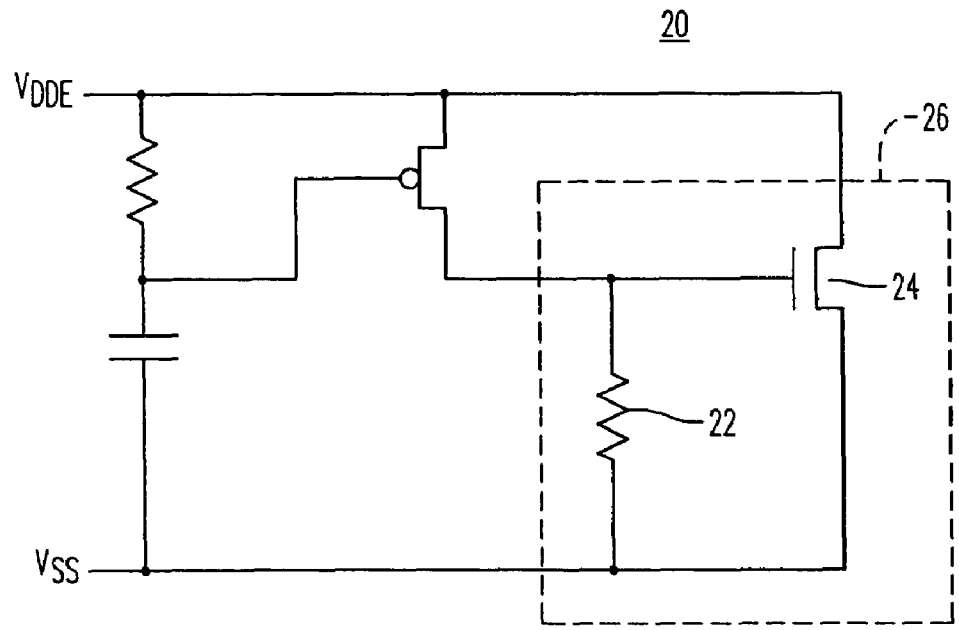
FIG. 2 illustrates an exemplary circuit diagram of a second implementation of a conventional clamping circuit.
Figure 3:
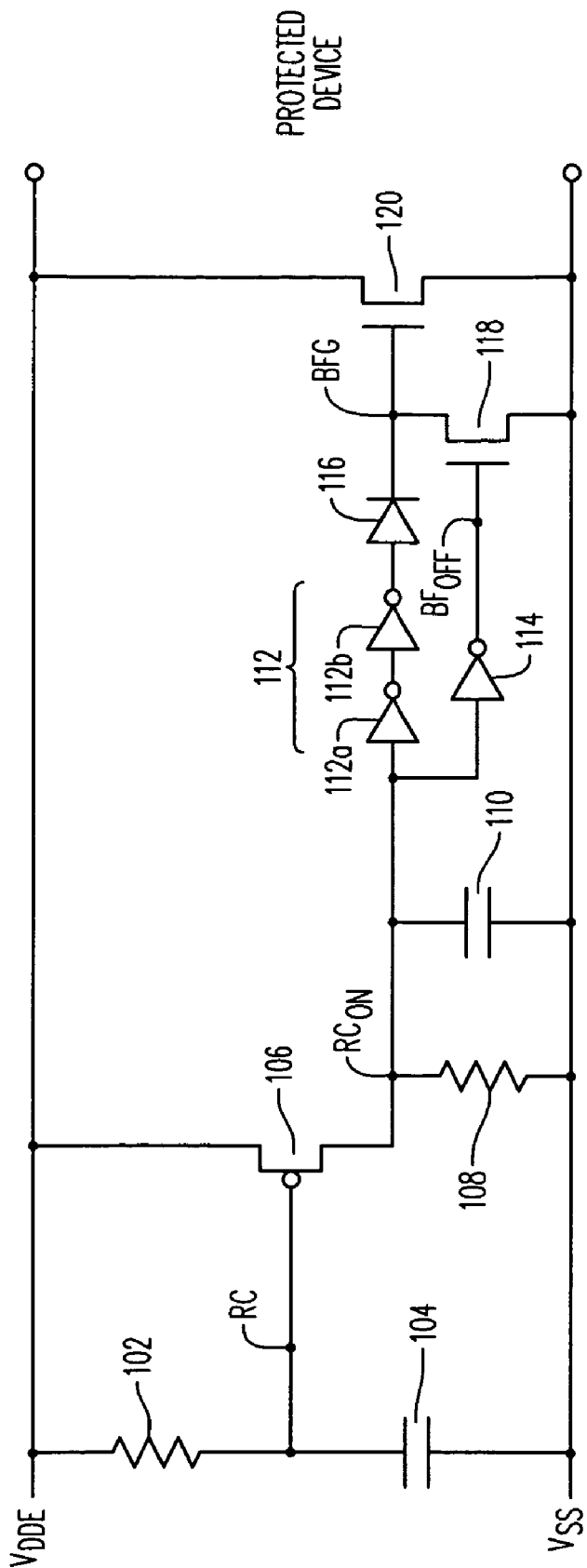
FIG. 3 illustrates an exemplary circuit diagram of an electrostatic discharge protection circuit in accordance with an embodiment of the present invention.

An exemplary electrostatic discharge protection device will now be described with reference to FIG. 3.

The exemplary electrostatic discharge protection device 100 for limiting the effects of an electrostatic discharge event comprises a first RC network comprising a first resistor 102 connected in series with a first capacitor 104. The first resistor is connected to the voltage rail $V_{DDE}$ and the first capacitor 104 is connected to the substrate voltage rail $V_{SS}$. The gate terminal of a first transistor 106 is connected to a node RC between the first resistor 102 and the first capacitor 104. The source terminal of the first transistor 106 is connected to the input voltage rail $V_{DDE}$. During normal conditions, e.g. prior to the onset of an ESD event, the first capacitor 104 holds the voltage at node RC to $V_{SS}$, which is a low voltage, enabling the turn on of first transistor 106 when a voltage is applied to $V_{DDE}$. In the illustrated embodiment, the first transistor 106 is a p-channel mosfet transistor. A second resistor 108 and a second capacitor 110 are connected in parallel to one another between the drain terminal of the first transistor 106 and the substrate voltage rail $V_{SS}$. The first RC network maintains a voltage at node $RC_{on}$ that initially tracks the input voltage $V_{DDE}$ and discharges slowly over time. Thus, when there is a rapid rise in the voltage level $V_{DDE}$ at the onset of an ESD event, this voltage at node $RC_{on}$ is passed through an isolation buffer 112 and blocking device 116 to the gate of the clamping transistor 120 to turn it on.

The clamping transistor 120 constitutes the clamping FET. For this purpose, the clamping transistor 120 is preferably a very large (BIG) FET (BIGFET) N-channel mosfet (NMOS) transistor.

The blocking device 116 is connected in series with the isolation buffer 112 and is preferably a diode, the cathode of which is connected to the gate of the clamping transistor 120. The clamping transistor 120 has its drain terminal connected to the input voltage rail $V_{DDE}$, its source terminal connected to the substrate voltage rail $V_{SS}$ and its gate terminal connected to the cathode of the blocking device 116.

The purpose of the blocking device 116 is to maintain a charge on node BFG at the gate of the transistor 120, even as the ESD event dissipates. The initial charge is a direct result of the voltage at the $RC_{on}$ node of the second RC network comprising resistor 108 and second capacitor 110. As the voltage at $RC_{on}$ dissipates, the voltage of BFG is blocked from dissipating by the blocking device 116. Therefore, it maintains a logic high and subsequently the clamping transistor 120 is maintained in a strong "on" state. As the ESD event voltage dissipates to zero volts, inverter 114 loses power and is not able to drive $BF_{OFF}$ to an active state.

The purpose of the second RC network is to turn off the clamping transistor 120, after a sufficient delay, during a normal (non-ESD) power on event.

The second RC network time constant at $RC_{on}$ is much greater than the time period for the electrostatic discharge event and therefore elements 108, 110, 114 and 118 have no significant effect during an ESD event. After the electrostatic discharge event occurs, the node $RC_{on}$ will eventually discharge but the power supply, $V_{DDE}$, for inverter 114 will have been previously discharged, rendering inverter 114 and clamp turnoff transistor 118 inoperable.

The isolation buffer 112 is connected to the drain terminal of the first transistor 106, which is also connected to the terminals of the second resistor 108 and the second capacitor 110. The isolation buffer 112 preferably comprises two inverters 112a and 112b in series. The purpose of the isolation buffer 112 is to ensure that the voltage from the node $RC_{on}$ is maintained at a high level, thereby providing a logic low to $BF_{OFF}$, keeping clamp-turn off transistor 118 turned off during an ESD event. Without isolation buffer 112, at the start of an ESD event, clamp turn off device 118 could pull node $RC_{on}$ to $V_{SS}$ through the blocking diode, causing improper operation of the clamping transistor 120. Without isolation buffer 112, the clamping transistor 120 may not turn on or may only turn on partially. The clamp-turn off transistor 118 is preferably an n-channel mosfet transistor.

During a normal power on event, the voltage at $RC_{on}$ will discharge slowly to $V_{SS}$. Inverter 114 is designed with an extra low voltage switch point. After a sufficiently long period, inverter 114 turns on and outputs a signal at the node $BF_{OFF}$ which turns on clamp-turn off transistor 118. The clamp-turn off transistor 118 has its drain terminal connected to the gate terminal of the clamping transistor 120 and the source terminal of the clamp-turn off transistor 118 is connected to the substrate voltage rail $V_{SS}$. Once the clamp-turn off transistor 118 is turned on, the voltage of node BFG dissipates, based on the RC characteristics of the clamp-turn off transistor 118 and the clamping transistor 120, to thereby turn off the clamping transistor 120.

The extra low voltage switch point device 114 may be formed using well-known techniques in semiconductor device fabrication. For instance, the extra low voltage switch point device 114 may be implemented as an inverter having complementary transistors. The low voltage switch point is preferably attained by making the n-channel device much wider than the p-channel device.

Figure 4:
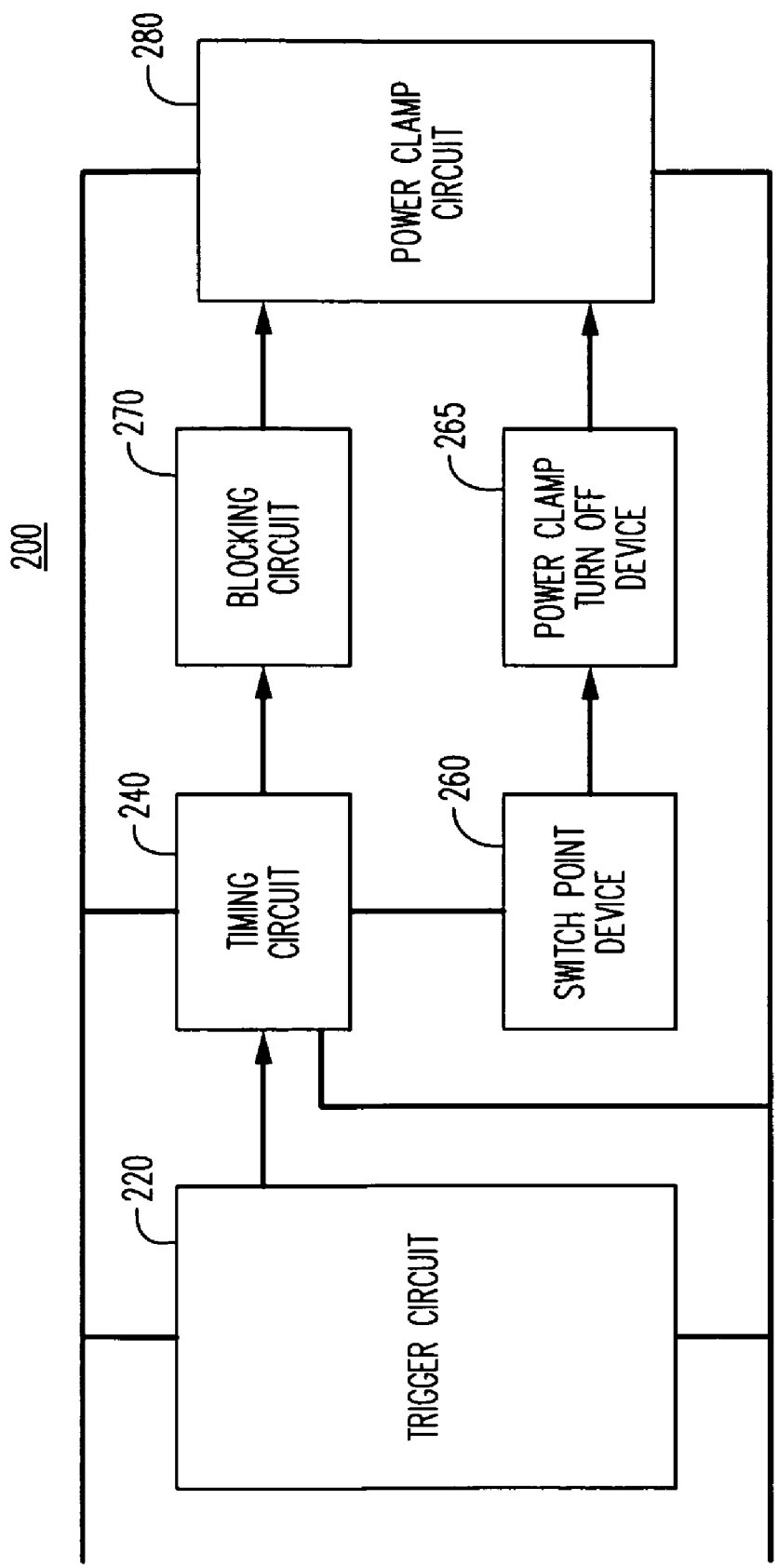
FIG. 4 illustrates a block diagram of an electrostatic discharge protection circuit.

In another exemplary embodiment illustrated in FIG. 4, the electrostatic discharge protection device 200 comprises a trigger circuit 220, a timing circuit 240, a power clamp circuit 280, a power clamp turn-off device 265, a blocking circuit 270, and a switch point device 260. The trigger circuit 220 responds to a rise of an input voltage VDDE by outputting a trigger signal. The trigger signal preferably activates a transistor to output a signal to a timing circuit 240. The timing circuit 240 maintains a predetermined voltage level at a first predetermined node for a predetermined amount of time. The predetermined amount of time corresponds to the resistive and capacitive characteristics of the timing circuit 240. A blocking circuit 270 preferably comprising a blocking diode maintains the predetermined voltage level output to a power clamping circuit 280 after the predetermined amount of time of the timing circuit 240 has expired. The power clamp circuit 280 is turned on by the predetermined voltage and discharges the current caused by the rise in the input voltage. The power clamp circuit preferably comprises an n-channel transistor. A switch point device 260, preferably an inverter, provides a signal to a power clamp turn-off device 265, which is preferably a transistor, for turning off the power clamp circuit 280. The switch point device 260 activates the power clamp turn-off device 265 after a sufficiently long period of time, during a normal power on event.

The operation of the exemplary electrostatic discharge protection device when an ESD event occurs will now be described with reference to FIG. 3. The voltage $V_{DDE}$ rapidly rises at the onset of the ESD event, but the voltage at node RC remains low for a predetermined amount of time. The predetermined amount of time is based on the values of resistor 102 and capacitor 104. As a result of the voltage at node RC remaining low, first transistor 106 begins to conduct. When first transistor 106 conducts the voltage at node $RC_{ON}$ tracks $V_{DDE}$. The voltage at node BFG rises to the level of $V_{DDE}$ and is maintained at a logic high level by blocking diode 116. The logic high voltage at node BFG causes second transistor 120 to conduct which minimizes the $V_{DDE}$ voltage rise to predetermined maximum value. This is because the second transistor 120 acts as a current sink and conducts a large amount of current thereby reducing the voltage associated with the electrostatic discharge event. Preferably, the voltage $V_{DDE}$ is limited to a maximum of approximately 7 volts or less. During a normal power on event, the voltage at $RC_{ON}$ diminishes based on the time constant of the second RC network, which is comprised of resistor 108 and capacitor 110. When the $RC_{ON}$ voltage reaches a predetermined voltage, clamp-off transistor 118 begins to conduct and turns off the second transistor 120. The voltage at node BFG is discharged based on the RC characteristics of the clamp-off transistor 118 and the second transistor 120.

While the ESD event is dissipating, the voltage $V_{DDE}$ begins to drop. However, the blocking diode 116 maintains a voltage at the gate of the second transistor 120, to keep the transistor in a strong-on state. As the voltage $V_{DDE}$ is discharged, inverter 114 and clamp turn-off transistor 118 lose their power supply and lose their ability to turn off the power clamp. As a result, the second transistor 120 stays fully turned on for a much longer period of time and at a much stronger strength than prior art clamping circuits whose operation is directly tied to the voltage $V_{DDE}$. This extended duration enables the ESD event to be quickly and fully dissipated, and the power bus of the circuit, $V_{DDE}$, to be fully discharged.

Figure 5:
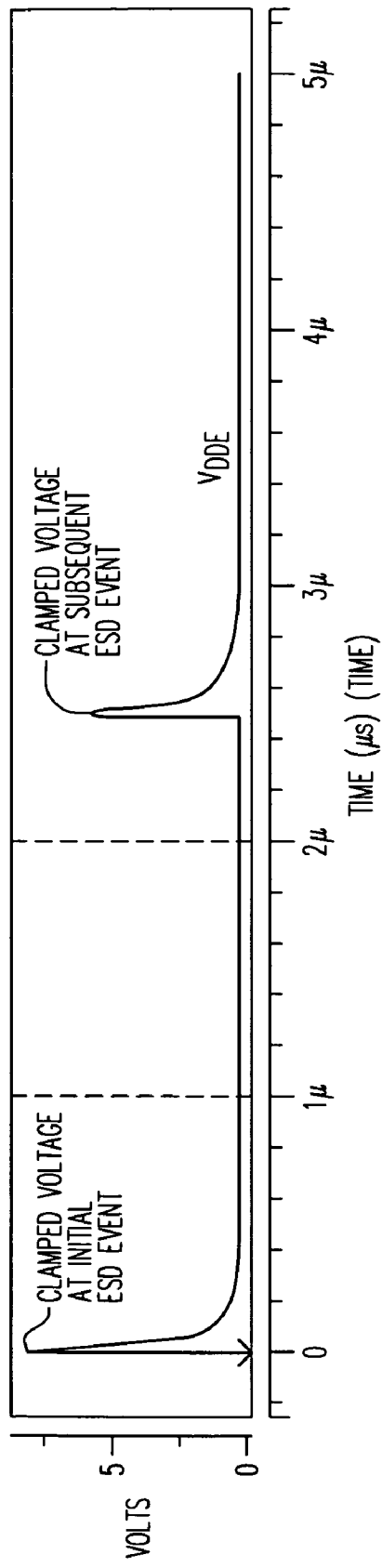
FIG. 5 is a graph illustrating the exemplary clamped voltages for an initial and subsequent ESD events according to embodiments of the present invention.

If a subsequent ESD event occurs before the node BFG is discharged, the ESD protection device provides an even faster response than the response to the initial ESD event. The capacitance of the $V_{DDE}$ is in a fully discharged state and thereby able to absorb some of the charge induced by the subsequent ESD event. Since a blocking diode causes the second transistor 120 or power clamping circuit 280 to remain on, the ESD protection circuit can react more quickly to the electrostatic discharge event. Therefore, as shown in FIG. 5, the voltage $V_{DDE}$ is clamped to a lower level during a subsequent ESD event than the initial ESD event.

Figure 6:
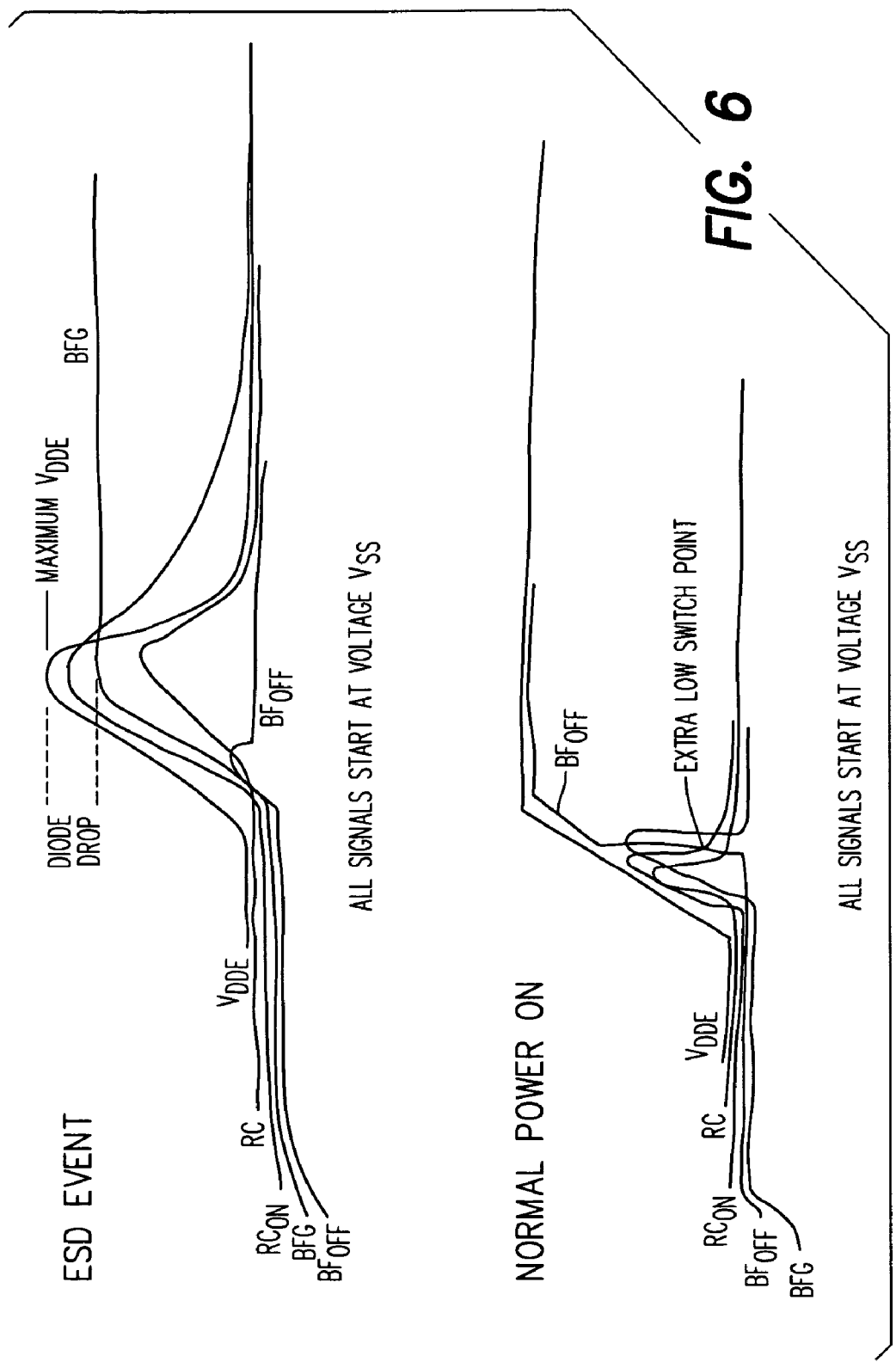
FIG. 6 illustrates exemplary component waveforms that occur during an ESD event and a normal power on event.

FIG. 6 shows waveforms associated with an ESD event and a normal power on event. As can be seen from the waveforms of the ESD event, the input voltage $V_{DDE}$ begins to rise rapidly in which case the trigger signal which is the voltage $RC_{ON}$ also begins to rise with relation to the voltage $V_{DDE}$. The voltage at node $RC_{ON}$, which is the node at the connections of first transistor 106, resistor 108 and capacitor 110, rises to a sufficient level causing the voltage at node BFG to rise to a logic high where it is maintained by the blocking diode 116 during the ESD event, while the voltage at node $BF_{OFF}$ remains low for the course of the ESD event.

During a normal power on, it can be seen that voltage $V_{DDE}$ rises steadily to a predetermined level in which case the voltage RC rises as it normally would. The voltage at node $RC_{ON}$ begins to rise, but then trails off as the resistor 108 discharges node $RC_{on}$. As the voltage at $RC_{ON}$ drops to a sufficiently low value, the device 114 switches to active the clamp-off transistor 118. The length of time before the transistor 118 is activated is determined by the time constant of the RC circuit 108/110. Depending on the type of power supply being used to power circuit, the rise of $V_{DDE}$ can be in the range of between 1/10 of a microsecond to 10 milliseconds. Also, there are generally different voltages that may be supplied by the power supply and they range from 2.5 volts to 5 volts. It is preferable that the power clamp circuit does not turn on when the circuit experiences a normal power on cycle. If power on occurs rapidly, the second transistor 120 may turn on, but once $V_{DDE}$ stabilizes the voltage at $RC_{ON}$ causes it to turn off quickly, so that the operation of the protected circuits is not adversely affected.

While the invention has been shown and described with particular reference to various embodiments thereof, it will be understood that variations and modifications in form and details may be made therein without departing from the spirit and scope of the invention as defined in the appended claims.

The invention claimed is:

1. An electrostatic discharge protection device for limiting the effects of electrostatic discharge, comprising:
   a first resistor connected in series with a first capacitor between an input voltage rail and a substrate voltage rail;
   a mosfet transistor having a gate terminal connected to a node between the first resistor and the first capacitor, and a source terminal connected to the input voltage rail;
   a second resistor and a second capacitor connected in parallel to one another between the drain terminal of the mosfet transistor and the substrate voltage rail;
   a blocking device connected to the second resistor and the second capacitor; and
   a second transistor having its drain terminal and source terminal connected between the voltage rails and its gate terminal connected to the cathode of the blocking device, wherein the blocking device is connected in series with the drain of the mosfet transistor and the gate terminal of the second transistor.

2. The electrostatic discharge protection device of claim 1, further comprising:
a clamp-turn off transistor having a first terminal connected to the gate terminal of the second transistor and a second terminal connected to the substrate voltage rail; and
an extra-low voltage switch point device connected between the drain of the first transistor and the gate of the clamp-turn off transistor.

3. The electrostatic discharge protection device of claim 1, further comprising:
an isolation buffer connected between the blocking device and the second resistor and the second capacitor.

4. The electrostatic discharge protection device of claim 1, wherein the mosfet transistor is a p-channel mosfet.

5. The electrostatic discharge protection device of claim 1, wherein the blocking device comprises a diode for inhibiting a decrease in the voltage at the gate of the second transistor when the voltage at said input voltage rail decreases.

6. The electrostatic discharge protection device of claim 5, wherein the second transistor is a very large NMOS.

7. The electrostatic discharge protection device of claim 6, wherein the anode of the diode is connected to the output of an isolation buffer.

8. The electrostatic discharge protection device of claim 3, wherein the isolation buffer tracks the voltage on the input voltage rail.

9. The electrostatic discharge protection device of claim 2, wherein the extra-low voltage switch point device turns on the clamp-turn off transistor when the voltage at a specific node reaches a predetermined minimum threshold voltage.

10. The electrostatic discharge protection device of claim 9, wherein the clamp-turn off transistor reduces the voltage at the gate of the second transistor.

11. An electrostatic discharge protection device comprising:
a trigger circuit for responding to a rise of an input voltage by outputting a trigger signal;
a timing circuit for maintaining a predetermined voltage level at a predetermined first node of the timing circuit for a predetermined amount of time;
a power clamp circuit for minimizing the rise of the input voltage and discharging current caused by the rise in the input voltage, wherein the power clamping circuit is turned on by the predetermined voltage at a second node; and
a blocking circuit for maintaining the predetermined voltage level at the second node after the predetermined amount of time has expired.

12. The electrostatic discharge protection device of claim 11, wherein the trigger circuit comprises a resistor and capacitor network.

13. The electrostatic discharge protection device of claim 11, wherein the timing circuit comprises a resistor and capacitor network configured differently from the trigger circuit.

14. The electrostatic discharge protection device of claim 11, wherein the power clamp circuit comprises a very large NMOS transistor.

15. The electrostatic discharge protection device of claim 11, further comprising a power clamp turn-off device for by-passing the blocking circuit.

16. The electrostatic discharge protection device of claim 11, wherein the blocking circuit is a diode.

17. The electrostatic discharge protection device of claim 11, further comprising an isolation buffer that tracks the input voltage.

18. The electrostatic discharge protection device of claim 11, further comprising a switch point device for providing a signal to a power clamp turn-off device for turning off the power clamp circuit.

19. The electrostatic discharge protection device of claim 18, wherein the switch point device turns off the power clamp-turn off device when the input voltage reaches a predetermined minimum threshold voltage.

20. The electrostatic discharge protection device of claim 11, wherein the power clamp circuit is turned off after a second predetermined amount of time during which the voltage at the second node is dissipating.

21. A method for minimizing the rise of the input voltage level and discharging the current caused by the rise in the input voltage level, the method comprising the steps of:
outputting a trigger signal in response to a rise of an input voltage level;
maintaining a predetermined voltage level at a predetermined first node for a predetermined amount of time;
turning on a power clamping circuit by providing the predetermined voltage at a second node to minimize the rise of the input voltage to a predetermined initial threshold and discharge the input current through the power clamp circuit;
preventing the predetermined voltage level from dissipating at said second node after the predetermined time period has expired.

22. The method of claim 21, wherein the outputting of the trigger signal occurs when the input voltage level rises to a predetermined voltage level within a predetermined time period.

23. The method of claim 21, further comprising the steps of:
turning off the power clamping circuit during a normal, non ESD power on event.

* * * * *